United States Patent
Mikhailov et al.

(10) Patent No.: US 9,898,559 B2
(45) Date of Patent: Feb. 20, 2018

(54) METHOD FOR PREDICTING CHANGES IN PROPERTIES OF A FORMATION IN A NEAR-WELLBORE AREA EXPOSED TO A DRILLING MUD

(71) Applicant: Schlumberger Technology Corporation, Sugar Land, TX (US)

(72) Inventors: Dmitry Mikhailov, Moscow (RU); Valery Vasilievich Shako, Moscow Region (RU); Nikita Ilyich Ryzhikov, Moscow (RU); Alexander Nikolaevich Nadeev, Spring, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 732 days.

(21) Appl. No.: 14/331,227

(22) Filed: Jul. 15, 2014

(65) Prior Publication Data
US 2015/0039275 A1  Feb. 5, 2015

(30) Foreign Application Priority Data
Jul. 30, 2013 (RU) ............................... 2013135670

(51) Int. Cl.
*G06F 17/50* (2006.01)
*E21B 37/00* (2006.01)
(Continued)

(52) U.S. Cl.
CPC .......... *G06F 17/5009* (2013.01); *E21B 37/00* (2013.01); *E21B 43/00* (2013.01); *E21B 49/005* (2013.01)

(58) Field of Classification Search
CPC .............................. E21B 49/00; G06F 17/5018
(Continued)

(56) References Cited

U.S. PATENT DOCUMENTS

| 4,122,095 A | 10/1978 | Watt et al. |
| 4,982,086 A | 1/1991 | Withjack |

(Continued)

FOREIGN PATENT DOCUMENTS

| RU | 2331056 C1 | 8/2008 |
| SU | 1182331 A1 | 9/1985 |
| SU | 1341558 A1 | 9/1987 |

OTHER PUBLICATIONS

L. Bailey, et al., "Particulate Invasion From Drilling Fluids", SPE European Formation Damage Conference, The Hague, The Netherlands, May 31-Jun. 1, 1999.
(Continued)

*Primary Examiner* — Andy Ho (57) ABSTRACT

In order to predict properties of a formation in a near-wellbore area exposed to a drilling mud rheological properties of the drilling mud, of a filtrate of the drilling mud and of a reservoir fluid are determined. Properties of an external mudcake, porosity and permeability of the core sample are determined. A mathematical model of the external mudcake is created. The drilling mud is injected through a core sample and dynamics of pressure drop across the sample and dynamics of a flow rate of a liquid leaving the sample are determined. Using an X-ray micro Computed Tomography a profile of concentration of particles of the drilling mud penetrated into the sample is determined. A mathematical model is developed for the internal mudcake to describe dynamics of changes in concentration of the particles of the drilling mud in a pore space of the core sample. A coupled mathematical model of the internal and the external mudcakes is created and parameters of the mathematical model of the internal mudcake are determined providing matching of simulation results to the experimental data on injection (Continued)

the drilling mud through the core sample and to the concentration profile of the particles of the drilling mud.

13 Claims, 5 Drawing Sheets

(51) Int. Cl.
    *E21B 43/00*     (2006.01)
    *E21B 49/00*     (2006.01)

(58) Field of Classification Search
    USPC ........................................................ 703/2, 10
    See application file for complete search history.

(56) References Cited

U.S. PATENT DOCUMENTS

| | | | | |
|---|---|---|---|---|
| 5,027,379 | A * | 6/1991 | Hunt | .................... G01N 23/046 |
| | | | | 175/42 |
| 5,497,312 | A | 3/1996 | Erisman | |
| 5,663,499 | A | 9/1997 | Semmelbeck et al. | |
| 6,061,634 | A | 5/2000 | Belani et al. | |
| 6,609,067 | B2 * | 8/2003 | Tare | ........................ E21B 21/08 |
| | | | | 702/9 |
| 7,099,811 | B2 | 8/2006 | Ding et al. | |
| 8,849,637 | B2 * | 9/2014 | Chavez | ................... E21B 49/00 |
| | | | | 703/10 |
| 8,873,701 | B2 | 10/2014 | Mikhailov et al. | |
| 9,097,103 | B2 * | 8/2015 | Pop | ........................ E21B 49/08 |
| 2009/0029878 | A1 * | 1/2009 | Bicerano | ................ C09K 8/035 |
| | | | | 507/107 |
| 2013/0010918 | A1 | 1/2013 | Mikhailov et al. | |
| 2013/0010919 | A1 | 1/2013 | Mikhailov et al. | |
| 2013/0135670 | A1 | 5/2013 | Kawasato | |

OTHER PUBLICATIONS

F. Civan, "Reservoir Formation Damage: Fundamentals, Modeling, Assessment and Mitigation," Gulf Publishing Company, 2000, Houston TX, USA.

F. Civan, "Reservoir Formation Damage: Fundamentals, Modeling, Assessment and Mitigation," Second Edition, Gulf Publishing Company, 2007, p. 1089.

J.T. Dewan, M.E. Chenevert, "Mudcake Buildup and Invasion in Low Permeability Formations; Application to Permeability Determination by Measurement While Drilling," in SPWLA/CWLS 34th Annular Logging Symposium , Jun. 13-16, 1993, Society of Professional Well Log Analysts, Calgary, Alberta.

R.C. Gonzalez, R.E. Woods, "Digital Image Processing" Pearson Prentice Hall, New Jersey, 2008.

R.G. Guedes, F. Al.-Abduwani, P. Bedrikovetsky, P.K. Currie "Deep-Bed Filtration Under Multiple Particle-Capture Mechanizms," Society of Petroleum Engineers, Sep. 2009, SPE Journal pp. 477-487.

N. K. Korsakova, V.I. Pen'kovski, M.I. Epov, "Hydrodynamic and Electromagnetic Model of Strata Saturated with Oil and Free Gas," Doklady Physics. vol. 50. No. 1, 2005, pp. 52-55 (Translated from Doklady Akademii Nauk. vol. 400. No. 2. pp. 200-203).

F. Kuchuk, et al., "Determination of In-Situ Two-Phase Flow Properties Through Downhole Fluid Movement Monitoring," Society of Petroleum Engineers, SPE Annual Technical conference and Exhibition, Denver, Colorado, USA Sep. 21-24, 2008.

A. Lohne, et al. "Formation Damage and Well Productivity Simulation," Society of Petroleum Engineers, SPE European Formation Damage Conference, Scheveningen, The Netherlands, May 27-29, 2009.

J.T. Dewan, M.E. Chenevert, "A Model for Filtration of Water-base Mud During Drilling: Determination of Mudcake Parameters," Petrophysics, 2001, V. 42, No. 3, pp. 237-250.

D. Longeron, J. Alfenore, N. Salehi, S. Saintpère, "Experimental Approach to Characterize Drilling Nud Invasion, Formation Damage and Cleanup Efficiency in Horizontal Wells with Openhole Completions," SPE International Symposium on Formation Damage Control, Lafayette, Louisiana, Feb. 23-24, 2000.

J.P.Herzig, D.M. Leclerc, P. Le Goff, "Flow of Suspensions through Porous Media—Application to Deep Filtration," Industrial and Engineering Chemistry. vol. 62 No. 5, May 1970, pp. 8-35.

K.J.Ives, V. Pienvichitr, "Kinetics of filtration of dilute suspensions," Chemical Engineering Science. vol. 20. No. 11, 1995, pp. 965-973.

* cited by examiner

METHOD FOR PREDICTING CHANGES IN PROPERTIES OF A FORMATION IN A NEAR-WELLBORE AREA EXPOSED TO A DRILLING MUD

CROSS-REFERENCE TO RELATED APPLICATION

This application claims priority to Russian Application No. 2013135670 filed Jul. 30, 2013, which is incorporated herein by reference in its entirety.

BACKGROUND

The disclosure relates to methods for predicting changes in characteristics of a near-wellbore area of an oil/gas bearing formation exposed to a penetrating mud (or cleaning fluids) during drilling, completion and cleaning wellbores.

Drilling muds are complex mixtures containing solid particles (having size from under one micron to few millimeters), clay and organic additives (polymers, starch, surfactants, etc.) suspended in a "carrying" fluid which forms a base of the mud: this can be water, oil, diesel fuel or synthetic fluid.

Overbalanced well drilling and completion can result in invasion of drilling mud components into a formation changing porosity and permeability properties, a multizone structure of a near-wellbore area is formed. Usually there are an external mudcake (which is formed at a borehole wall and consists of solid particles and clay filtered from the mud), an internal mudcake (formed by mud particles penetrating into formation rocks) and an invaded zone (a zone invaded by a drilling mud filtrate).

During clean-up jobs (bringing wellbores on production regime) components of a drilling mud are partially washed out from a near-wellbore area. Nevertheless, some components remain inside a pore space of a formation rock which results in degradation of properties of the near-wellbore area, first of all in reduction of permeability of the near-wellbore area. As a result, well productivity is reduced. To describe this phenomenon the term "damage of a near-wellbore zone" (or, for simplification, "formation damage") is usually used.

The majority of mathematical models describing drilling mud invasion account only for formation/removal of an external mudcake and an invasion of a drilling mud filtrate (water/oil/diesel fuel) into reservoir rock; it is assumed that drilling mud particles do not penetrate into reservoir rocks.

Historically, a numerical simulation of dynamics of invasion of a drilling mud filtrate was used in methods for estimation of reservoir properties by comparing a calculated and apparent radial distribution of electric resistance obtained through multi-sonde; later results of simultaneous inversion of multi-sonde induction logging were used in combination with pressure dynamics obtained during downhole well sampling. These methods take into account a potential change in permeability and other properties of the bottomhole area resulting from invasion of drilling mud components only as an additional hydraulic resistance (associated with formation both internal and external mudcakes).

A more detailed workflow accounting for mechanisms affecting the properties of a near-wellbore area caused by penetrated drilling mud components is described, for example, in U.S. Pat. No. 7,099,811. The method is based on laboratory filtration experiments using long (40 cm) core samples; the experiments comprises injecting a drilling mud into a core sample followed by injection of a reservoir fluid from an opposite end of the core to simulate cleaning process. Profiles of damaged and repaired permeability were obtained along the core sample in laboratory filtration experiments; these results were used as input parameters for hydrodynamic simulation which takes accounts for distribution of permeability in the near-wellbore area using a cylindrical grid with small cells (of the order of a few millimeters) covering the area around the wellbore. Dynamics of change in permeability is modeled as a function of total volumetric flow through the core sample. The disadvantage of this approach deals with necessity to carry out a separate, sufficiently long, laboratory experiment to analyze effect of even relatively small variations in concentrations of drilling mud components or properties of original ("pure") rock sample, or pressure drop during well drilling and clean-up jobs. This means that selecting optimum composition of a drilling mud, as well as finding and predicting an optimum drilling/clean-up regime for a wellbore requires a large number of laboratory experiments, especially when wellbores are drilled in a complex multizone formation.

SUMMARY

The method proposed provides for predicting changes in properties of a near-wellbore area such as permeability and saturation during well drilling/cleaning-up jobs due to penetration/removal of drilling mud components. This is achieved through a combination of mathematical modeling and laboratory filtration experiments, and due to using of X-ray micro Computed Tomography to obtain concentration curves for penetrated drilling mud particles that impose additional restrictions on solving an inverse problem to determine model parameters.

According to an embodiment of the invention rheological properties of a drilling mud, of a filtrate of the drilling mud and of a reservoir fluid are determined. Properties of an external mudcake and porosity and permeability of a core sample are measured. A mathematical model of the external mudcake is developed to describe a growth of the external mudcake and invasion of the filtrate of the drilling through it.

The drilling mud is injected through the core sample and dynamics of pressure drop across the sample and dynamics of a flow rate of a liquid leaving the core sample are measured. In addition dynamics of a saturation profile of the filtrate of the drilling mud can be determined using, for example, measurements of electric resistance along the sample length when the drilling mud is injected into the core sample.

Then X-ray micro Computed Tomography of the core sample is carried out; the results obtained are used to determine a profile of concentration of particles of the drilling mud that had penetrated into the sample. A mathematical model of an internal mudcake is developed to describe dynamics of changes in concentration of the particles of the drilling mud in a pore space of the core sample and associated changes in permeability of the core sample.

Then a coupled mathematical model of both internal and external mudcakes is developed, the model includes the model of the external mudcake and the model of the internal mudcake. Using this coupled mathematical model of the internal and the external mudcakes, as well as previously measured properties of the external mudcake, parameters of the mathematical model of the internal mudcake are determined, the parameters provide matching of simulation results to the measured dynamics of pressure drop across the sample and measured dynamics of the flow rate of the fluid leaving the sample as well as to the determined profile of concentration of the mud particles that penetrated into the core sample. The parameters obtained for the mathematical model of the external mudcake and for the mathematical model of the internal mudcake are used to predict changes in properties of formation rocks in the near-wellbore area under effect of invaded mud components.

The following parameters of the mathematical model of the internal mudcake are determined for describing the dynamics of changes in the concentration of the particles of the drilling mud in the pore space of the core sample: a factor of intensity of decreasing permeability of the rock with the increasing share of the drilling mud particles retained in the pore space, a trapping coefficient for particles of an i-th type, a coefficient of mobilization of the i-th type particles, a critical mobilization velocity of the i-th type particles, an empirical coefficient depending on a structure of the pore space and on a mechanism of particle retention in pores.

Injection of the drilling mud through the core sample can be carried out with circulation of the mud along the tangent to an inlet surface of the core sample.

In addition, to model process of removal ("wash-out") of invaded components of the drilling mud a reservoir fluid can be injected into the core sample; the reservoir fluid is injected from the surface opposite to that from which the drilling mud is injected ("backflow process").

Before injecting the drilling mud into the sample a preliminary X-ray micro Computed Tomography of the core sample can be made.

If the mud components influencing filtration properties of the core sample have weak X-ray contrast (e.g., clay), a contrast agent can be added into the drilling mud.

If the size of the sample does not allow making X-ray micro Computed Tomography with a required resolution, a plug (e.g. cylinder) can be cut from the core sample to and X-ray computer microtomography is carried out with respect to the plug sample.

According to one embodiment of the disclosure it is possible to obtain parameters of the mathematical models of external and internal mudcakes for various types of drilling muds and core samples of various lithotypes; this allows building relationships ("correlations") between model parameters and properties of core samples and drilling mud properties. The relationships obtained are used to model dynamics of invasion or removal of components of different drilling muds that had invaded the near-wellbore area and to predict relevant changes in properties of the formation rocks in a near-wellbore area during well drilling/clean-up jobs. The properties of the core samples are permeability, characteristic pore size, and wettability.

BRIEF DESCRIPTION OF DRAWINGS

The invention is illustrated by drawings where.

DETAILED DESCRIPTION

Figure 1:
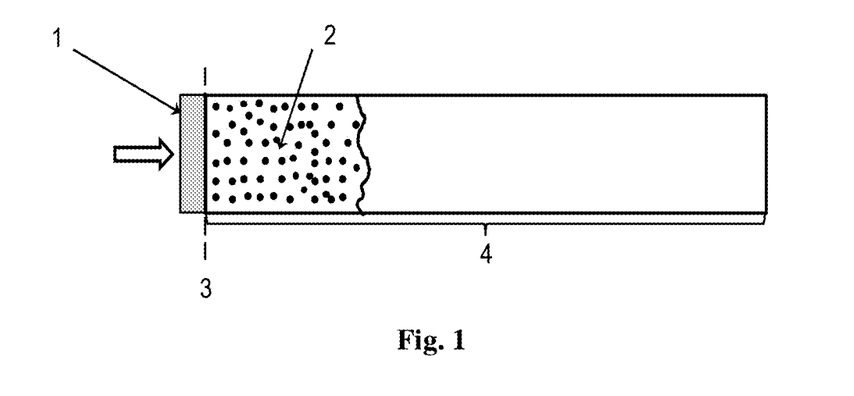
FIG. 1 shows external and internal mudcakes.

A drilling mud is prepared according to a given mud composition and a core sample is taken. The composition of any drilling mud includes a concentration and a type of solid phase (clay, solid particles) used to produce the drilling mud. As shown in FIG. 1, components of the drilling mud penetrate from a sandface (i.e. a contact between a borehole wall and a formation) 3 into the formation 4 causing change in porosity and permeability properties; as a result a complex multizone structure of a near-wellbore area develops. Usually in a near-wellbore area there are an external mudcake 1 (formed at the sandface 3: it consists of filtered solid particles and clay of the drilling mud), an internal mudcake 2 (formed by mud particles penetrating into the formation rocks) and a drilling mud filtrate invasion zone.

Rheological properties of the drilling mud, of the filtrate of drilling mud and of a reservoir fluid are determined using, for instance, RD 39-2-645-81 Method to control drilling mud parameters and GOST 33-2000 Oil products. Transparent and nontransparent liquids. Determination of kinematic viscosity and calculation of dynamic viscosity.

An experiment to determine a drilling mud filtration index is carried out according to RD 39-2-645-81 Method to control drilling mud parameters or other methods using filter press to push drilling mud through a filter paper or ceramic disk (see, for example, Dewan J. T., Chenevert M. E. A model for filtration of Water-base Mud During Drilling: Determination of Mudcake Parameters, Petrophysics, 2001, V. 42, no. 3, pp. 237-250). During this experiment a solid phase of the drilling mud is filtered at a surface of a filter paper (or a ceramic disk, depending on the type of experiment), forming a low-permeable mudcake which models an external mudcake formed at a borehole wall during drilling.

Figure 2:
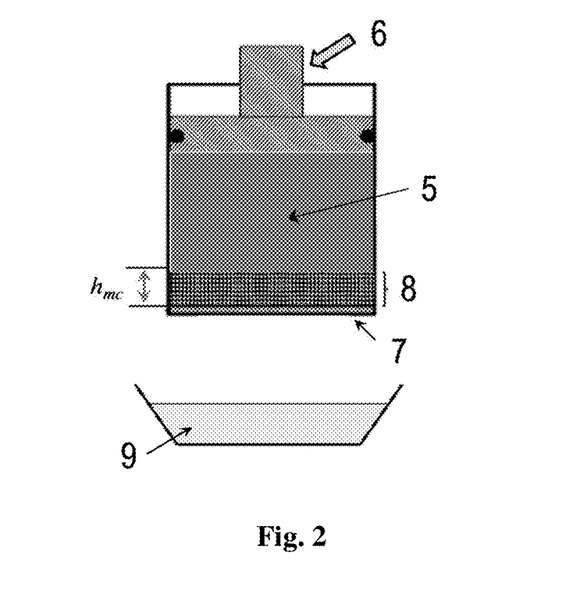
FIG. 2 shows a schematic diagram of a typical experiment to study properties of the external mudcake via injecting a drilling mud through a filter paper or ceramic disk.

FIG. 2 shows a schematic diagram of a typical experiment to analyze properties of the external mudcake using invasion of the drilling mud 5 using a press 6 into a filter paper (or a ceramic disc) 7 resulting in formation of a filtered solid phase layer (external mudcake) 8 having thickness $h_{mc}$; the drilling mud filtrate is collected in a special 9 measuring beaker.

A mathematical model of the external mudcake is created to describe a growth of the external mudcake and invasion of the mud filtrate through it. For the mathematical modeling a system of equations is used based on the balance of mass for particles and filtrate:

$$\frac{dh_{mc}}{dt} = -\frac{C_\Sigma u_{mf}}{(1-C_\Sigma)[1-\varphi_{mc}(\Delta p_{mc})]} - f_e, \quad (1)$$

$$div\, u_{mf} = 0, \quad (2)$$

and the Darcy law for filtration velocity through the external mudcake:

$$u_{mf} = -\frac{k_{mc}(\Delta p_{mc})}{\mu_{mf}} \frac{\Delta p_{mc}}{h_{mc}}, \quad (3)$$

where the filtrate of the drilling mud is assumed to be incompressible; t—is time; parameters with a subscript mc correspond to the external mudcake; $h_{mc}$—is a thickness of the external mudcake; $f_e$—is erosion ("wash-out") rate of the external mudcake caused by circulation of the drilling mud in an annulus; $u_{mf}$—is a flow rate of the drilling mud filtrate through the mudcake; $\mu_{mf}$—is a viscosity of the drilling mud filtrate; $\Delta p_m$—is pressure drop at the external mudcake; $k_{mc}$ and $\varphi_{mc}$—are permeability and porosity of the external mudcake, respectively; $C_\Sigma$—is a volume concentration of a solid phase in the drilling mud (in general the solid phase can consist of several different components).

The equation (1) describing the external mudcake growth includes a term describing its erosion ("wash-out") under the influence of drilling mud circulation in the annulus.

The system of equations (1)-(3) includes two closing relations $k_{mc}(\Delta p_{mc})$ and $\varphi_{mc}(\Delta p_{mc})$, describing change in permeability and porosity of the external mud cake when the pressure drop is changed (i.e. the compressibility of the external mudcake). The following power-law relation was confirmed experimentally (see, e.g., Dewan J. T., Chenevert M. E. A model for filtration of Water-base Mud During Drilling: Determination of Mudcake Parameters, Petrophysics, 2001, V. 42, no. 3, pp. 237-250):

$$k_{mc} = \frac{k_{mc0}}{(\Delta p_{mc})^\nu}, \varphi_{mc} = \frac{\varphi_{mc0}}{(\Delta p_{mc})^\delta}, \quad (4)$$

where $k_{mc0}$, $\varphi_{mc0}$—are reference permeability and porosity values, determined experimentally when $\Delta p_{mc}=1$ psi; $\nu$, $\delta$—are compressibility exponents, also obtained experimentally.

The following properties of the external mudcake are not known: permeability $k_{mc0}$, porosity $\varphi_{mc0}$, compressibility exponents $\nu$ and $\delta$.

These properties are determined (see, for example, Dewan J. T., Chenevert M. E. A model for filtration of Water-base Mud During Drilling: Determination of Mudcake Parameters, Petrophysics, 2001, V. 42, no. 3, pp. 237-250) on the basis of previous experiments on injecting the drilling mud through the filter paper or the ceramic disk.

Then open porosity and absolute permeability in the original core sample are determined, for example, according to GOST 26450.1-85 and GOST 26450.2-85.

A laboratory filtration experiment on injecting the drilling mud into the core sample is carried out. The laboratory equipment for filtration experiments using injection of the drilling mud comprises a filter cell (a core holder); it can also comprise a unit to measure electric resistance in different parts of the core sample along the sample length. Injecting the drilling mud into the core sample can be done in two ways: circulation of the fluid along a tangent of the inlet surface can be arranged or there can be no circulation. In order to reproduce a dynamic process of invasion of the drilling mud the laboratory experiments are carried out using representative downhole conditions (keeping the same temperature, formation overbalance and drilling mud shear rate). The injection of the drilling mud can be followed by injecting a reservoir fluid into the core sample from the opposite surface (backflow) to simulate the process of replacement ("wash-out") of drilling mud components.

Depending on specific design of the core holder it can be used to study samples having diameters from 0.8 to 5 cm and the length up to 30-40 cm. For example, a standard core holder is designed to study core samples with diameter of 3 cm and length 3-6 cm, however, there are models of longer core holders having several ports (typically 4-5) to measure pressure drop in different parts of the core during the filtration experiment (see for example Longeron D., Alfenore J., Salehi N., Saintpère S., 2000, Experimental approach to characterize drilling mud invasion, formation damage and cleanup efficiency in horizontal wells with openhole completions. SPE 58737).

During filtration experiment with the drilling mud dynamics pressure drop Δp(t) is measured in a core sample simultaneously with monitoring a flow rate of a fluid q(t) leaving the sample. Electric resistivity can be measured along the sample length allowing plotting a dynamic profile of sample saturation with the drilling mud filtrate. As a rule in practice dynamics of reduction/repairing of a core sample permeability as a function of volume of the injected fluid is used; it is calculated based on the recorded pressure drop dynamics and flow rate on the basis of the Darcy law:

$$q(t) = -\frac{k_{core}(t)}{\mu_*} A \frac{\Delta p(t)}{L} \quad (5)$$

where t is time; $k_{core}(t)$—is the core permeability; Δp(t)—is the pressure drop on the core sample; q(t) is the volume of the fluid leaving the core; L is a length of the core; A is a cross-section area of the core; μ*—is viscosity of the fluid leaving the core (in practice, when the drilling mud is injected this value is assumed to be equal to viscosity of the drilling mud filtrate; for backflow the viscosity should be equal to that of injected reservoir fluid).

Figure 3:
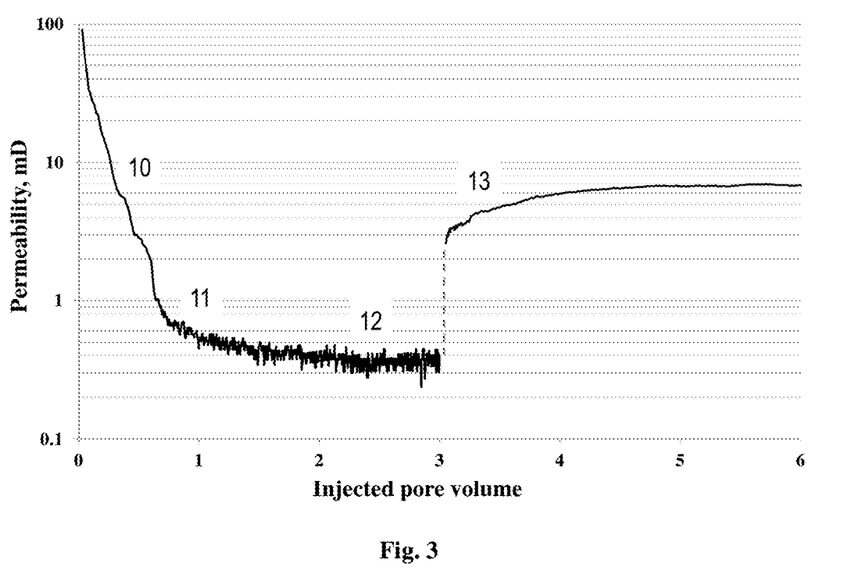
FIG. 3 shows an example of a change in permeability during laboratory filtration experiment through the core sample using a clay drilling mud; the graph shows typical phases of the process.

FIG. 3 shows an example of changing permeability during laboratory filtration experiment on injecting clay drilling mud into the core sample followed by backflow of the reservoir fluid at the opposite face of the core. The drilling mud was injected at a fixed value of pressure drop across the core in regime of circulation of the drilling mud along the tangent to the inlet surface of the core sample.

During injection of the drilling mud (see FIG. 3) there are three stages of changing the core permeability: fast drop at initial stage 10 due to formation of the internal mudcake, the subsequent smooth reduction of permeability 11 associated with the growth of the external mudcake and the final stage 12 when the permeability of the core remains practically constant due to stabilization of the thickness of the external mudcake because of erosion caused by circulating drilling mud and weak change of parameters of the internal mudcake. In the process of backflow complete or partial destruction of the external mudcake occurs (when the pressure drop exceeds a certainthreshold) and subsequent partial removal of the internal mudcake 13; this brings about a partial restoring (repairing) in core permeability.

The laboratory experiment with the drilling mud is followed by X-ray micro Computed Tomography of the core sample. A preliminary X-ray micro Computed Tomography can be carried out using the core sample prior to injection of the drilling mud; this improves the procedure of analyzing the data of X-ray micro Computed Tomography. If the drilling mud components that affect the filtration properties of the core have a weak X-ray contrast (e.g. clay), a contrast agent is added (for example, according to methodology outlined in the Russian Federation patent No 2467316).

Figure 4:
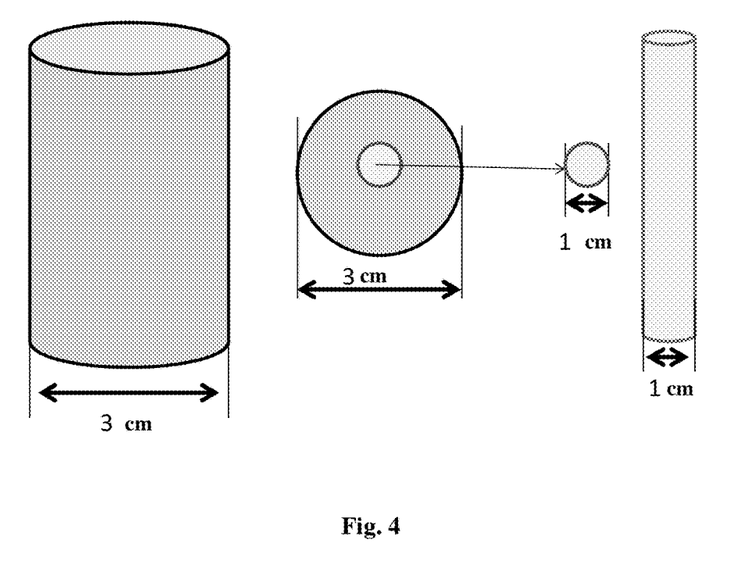
FIG. 4 shows examples of cut plug to carry out X-ray micro Computed Tomography.

If the core sample size does not allow carrying out X-ray micro Computed Tomography with a required resolution, a plug (e.g. a cylinder) can be cut out of the core sample to undergo microtomographic studies (see FIG. 4).

Figure 5:
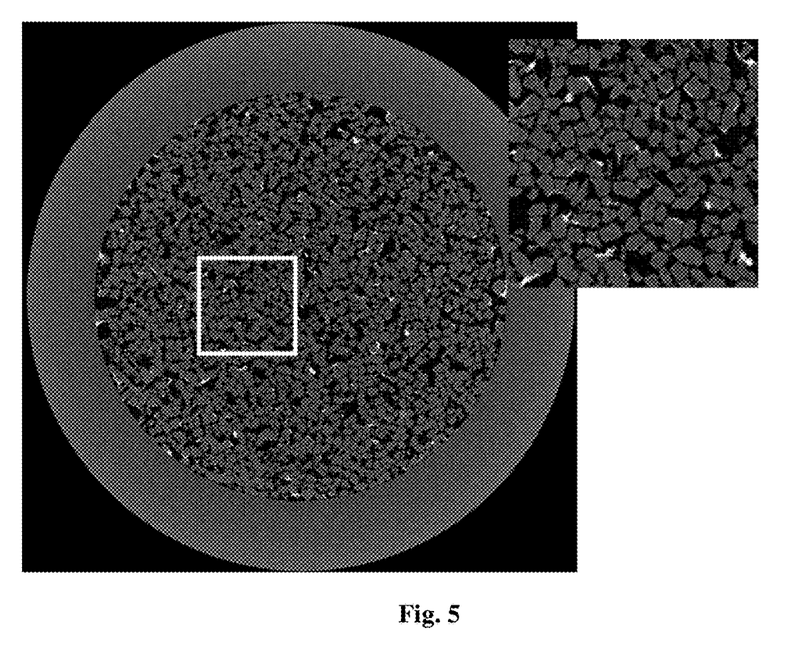
FIG. 5 shows a cross section of the core sample obtained using X-ray micro Computed Tomography, the sample contains clay mud particles modified by adding a special contrast agent.

An example of the core sample cross-section obtained by X-ray micro Computed Tomography showing clay particles modified through adding a special contrast agent is shown in FIG. 5.

Figure 6:
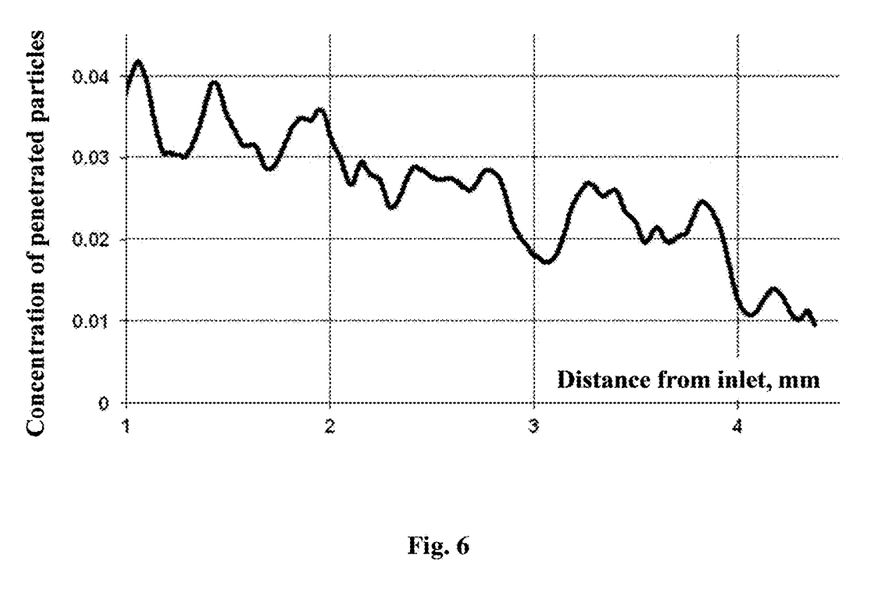
FIG. 6 illustrates an example of a restored concentration profile plotted for penetrated particles of mud in along-the-sample direction, FIG. 7 showing areas in a spatial grid covering a near-wellbore area to simulate invasion of components of drilling mud into formation.

The special analysis of the data of X-ray micro Computed Tomography (see, for example, US patent No. 20130010919) allows to obtain the concentration profile for particles penetrated into the sample; an example is given in FIG. 6.

Then a mathematical model of the internal mudcake is created to describe dynamics of changes of concentration of the drilling mud particles in a pore space of the core sample and the accompanying changes in permeability of the core sample.

In contrast to traditional model (see for example Herzig J. P., Leclerc D. M., Le Goff P., 1970, *Flow of Suspensions through Porous Media—Application to Deep Filtration, Industrial and Engineering Chemistry*. Vol. 62 No. 5) assuming particles being identical and describing the process of particles retention ("accumulation") and mobilization ("wash-out") in the porous medium using unique kinetic equation, the proposed mathematical model of transport and accumulation of drilling mud particles in a porous medium is generalized to describe transfer of two different types of particles. The difference in the physics properties of particles (e.g., size) is reflected by introducing two kinetic equations having substantially different filter ("trapping") and mobilization coefficients. If necessary, a third and subsequent particle types are added.

If reservoir permeability is lower than a certain determined critical value at the interface with the wellbore leading to deposition of all particles contained in the drilling mud on the wall of the wellbore (complete filtration), then an external mudcake is formed having thickness growing in time.

In this invention, the problem of drilling mud invasion is considered under the following assumptions: there are two fluids (a drilling mud filtrate and a reservoir fluid (oil, gas, or water)) participating in the process; the system is described by the linear Darcy law; the drilling mud consists of two types of non-compressible particles; velocity of particle motion is the same as the carrier fluid velocity (there is no slippage); the effects of diffusion are neglected; the particles can be either mobile or retained by porous traps.

Let us introduce the basic definitions before deriving the system of equations.

Let's consider some rock sample with a bulk volume $V_{bulk}$.

An initial pore volume (before invasion of the mud components) is $V_{pore}^0$:

$$V_{pore}^0 = V_{bulk} - V_{matrix} \quad (6)$$

where $V_{bulk}$—is a bulk volume of the rock sample; $V_{matrix}$ is a volume of a solid matrix (rock matrix) in the rock sample.

Initial porosity of the sample can be written as $\varphi_0$:

$$\varphi_0 = \frac{V_{pore}^0}{V_{bulk}} \quad (7)$$

During filtration of the drilling mud particles are retained by porous traps resulting in reduction of the pore volume $V_{pore}^{red}(t)$:

$$V_{pore}^{red}(t) = V_{bulk} - V_{matrix} - \sum_{i=1}^{2} V_{p_i}^t \quad (8)$$

where $V_{p_i}^t$ is a total volume of particles of the i-th type (i=1.2) retained in the rock sample.

Note that the pore volume becomes time dependent according to dynamics of particle retention ("accumulation") inside pore space.

Reduced (damaged) porosity is $\varphi(t)$:

$$\varphi(t) = \frac{V_{pore}^{red}}{V_{bulk}} \quad (9)$$

Saturation $s_\Lambda$ of the pore space by phase $\Lambda$ can be described as $$s_\Lambda = \frac{V_\Lambda}{V_{pore}} \quad (10)$$

where $V_\Lambda$—is a volume of phase $\Lambda$ in the rock sample.

Volume concentration of mobile particles of the i-th type in the drilling mud is $C_i$:

$$C_i = \frac{V_{pi}^m}{\sum_i V_{pi}^m + V_{mf}} \equiv \frac{V_{pi}^m}{V_{mud}} = \frac{s_{pi}}{s_{mud}} \quad (11)$$

where $$V_{mud} = \sum_i V_{pi}^m + V_{mf}$$

is a volume of the drilling mud inside the rock sample; $V_{mf}$—is a volume of drilling mud filtrate inside the rock sample; $v_{p_i}^m$—is a volume of mobile particles of the i-th type inside the rock sample; $s_{pi}$—is saturation of the pore space by mobile particles of the i-th type; $s_{mud}$—is saturation of the pore space by the drilling mud.

A volume fraction of the particles of the i-th type retained in the rock sample $\sigma_i$ is $$\sigma_i = \frac{V_{pi}^t}{V_{bulk}} \quad (12)$$

where $V_{pi}^t$ is the volume of retained particles of the i-th type in $V_{bulk}$ volume.

According to definition of initial and reduced porosity (7), (9) and the volume fraction of retained particles (12) we get the following expression for reduced ("damaged") porosity:

$$\varphi(\sigma_\Sigma) = \varphi_0 - \sigma_\Sigma \quad (13)$$

where $\sigma_\Sigma = \sigma_1 + \sigma_2$—is total fraction of retained particles of type 1 and 2.

The system of equations describing transport of the drilling mud components into reservoir rock contains mass balance equations for reservoir fluid, for the drilling mud filtrate and for two types of particles:

$$\frac{\partial}{\partial t}[\varphi(\sigma_\Sigma)\rho_{rf} s_{rf}] + div[\rho_{rf} u_{rf}] = 0 \quad (14)$$

$$\frac{\partial}{\partial t}[\varphi(\sigma_\Sigma)\rho_{mf} s_{mf}] + div[\rho_{mf} u_{mf}] = 0, \quad (15)$$

$$\frac{\partial}{\partial t}[\varphi(\sigma_\Sigma) s_{pi}] + div[C_i u_{mud}] = -q^i_{P_{trapping}} + q^i_{P_{mobilization}}, \quad (16)$$
$$i = 1, 2$$

$$\frac{\partial}{\partial t}\sigma_i = q^i_{P_{trapping}} - q^i_{P_{mobilization}}, \; i = 1, 2 \quad (17)$$

where t is time; $\rho_{rf}$—is density of the reservoir fluid; $\rho_{mf}$ is density of the drilling mud filtrate; $s_{rf}$—is saturation of pore space by the reservoir fluid; $s_{mf}$—is saturation of the pore space by the drilling mud filtrate; $s_{pi}$—is saturation of the pore space by particles of the i-th type; i—is a type of particles; $u_{rf}$—is filtration velocity of the reservoir fluid; $u_{mf}$—is filtration velocity of the drilling mud filtrate; $u_{mud}$—is filtration velocity of the drilling mud; $q_{p\;trapping}^i$—is intensity of retention of the i-th type particles inside reservoir rock; $q_{p\;mobilization}^i$—is intensity of mobilization of the i-th type particles inside rock.

The filtration velocities for the drilling mud and the reservoir fluid are determined according to the generalized Darcy law $$u_{mud} = -\frac{k(\sigma_\Sigma)k_{r,mud}(s_{mud}, \sigma_\Sigma)}{\mu_{mud}}\nabla p_{mud}; \quad (18)$$

$$u_{rf} = -\frac{k(\sigma_\Sigma)k_{r,rf}(s_{rf}, \sigma_\Sigma)}{\mu_{rf}}\nabla p_{rf},$$

where k—is reservoir permeability; $k_{r,mud}$—is relative permeability of the drilling mud; $k_{r,rf}$—is the relative permeability of the reservoir fluid; $\mu_{mud}$—is the drilling mud viscosity; $\mu_{rf}$—is viscosity of the reservoir fluid; $p_{mud}$—is pressure of the drilling mud; $p_{rf}$—is pressure of the reservoir fluid;

$$s_{mud} = s_{mf} + \sum_i s_{pi}.$$

—is saturation of the pore space with the drilling mud; $C_\Sigma = C_1 + C_2$—is total volume concentration of particles of the 1st and 2nd type in the drilling mud.

In accordance with definition of capillary pressure $p_{(c)}$:

$$p_c = p_{nw} - p_w, \quad (19)$$

where subscript "nw" corresponds to nonwetting phase; subscript "w" corresponds to wetting phase.

The filtration velocity of the drilling mud filtrate is determined by the following expression:

$$u_{mf} = (1 - C_\Sigma)u_{mud}. \quad (20)$$

To close the system we can make use of the known closure relationships determining the intensity of retention ("accumulation") and mobilization ("wash-out") of particles in the pore space, as well as changes in permeability (see, for example, Ives K. J., Pienvichitr V., 1965, Kinetics of filtration of dilute suspensions, Chemical Engineering Science. Vol. 20. No. 11; Herzig J. P., Leclerc D. M., Le Goff P., 1970, Flow of Suspensions through Porous Media—Application to Deep Filtration, Industrial and Engineering Chemistry. Vol. 62 No. 5):

$$q^i_{P_{trapping}} = \lambda^0_{ci} C_{pi} u_m, \quad (21)$$

$$q^i_{P_{mobilization}} = \lambda^0_{mi} \sigma_\Sigma (U - U_{ci}), \quad (22)$$

$$k(\sigma_\Sigma) = k_0\left(1 - \frac{\sigma_\Sigma}{\beta\varphi_0}\right)^M; \quad (23)$$

where $\lambda_{ci}^0$ is a filter ("trapping") coefficient of particles of the i-th type; $\lambda_{mi}^0$—is a mobilization coefficient of the i-th type particles; $U_{ci}$—is critical velocity of mobilization of the i-th type particles; M—is a factor controlling the rate of decrease in rock permeability as the fraction of the drilling mud particles retained ("accumulated") in the pore space grows; $\beta$ is permeability damage coefficient, depending on structure of geometry of the pore space and the mechanism of particle retention in pores.

Empirical parameters M, $\lambda_{ci}^0$, $\lambda_{mi}^0$, $U_{ci}$, $\beta$ of the mathematical model of the internal mudcake to describe dynamics of accumulation and removal the drilling mud particles in the sample pore space are unknown; these parameters can be determined through matching simulation results to the data of laboratory filtration experiments and concentration profile of the mud particles penetrated inside the sample (given by the data obtained for the sample using the X-ray micro Computed Tomography).

As the data obtained in the laboratory filtration experiments on injecting the drilling mud into the core sample account for the joint effect of both internal and external mudcakes (see, for example, FIG. 3), the coupled mathematical model is developed to describe the internal and external mudcake dynamics.

The coupling of the models developed for the external and the internal mudcakes is implemented using the following assumptions (see FIG. 1):

1. All particles penetrate the core sample (or formation) at initial stage of the drilling mud filtration; the particles are partially retained ("accumulated") in the pore space resulting in deposition of the internal mudcake 2 shown in FIG. 1; this leads to reduction in permeability of the formation rock.

2. If the permeability of the core sample in vicinity to inlet surface (or permeability of the formation next to the borehole wall) 3 in FIG. 1 is reduced to a certain critical value $k_{crit}$, then the particles can no longer enter the rock and are filtering out at the core surface (or the borehole wall) forming the external mudcake 1 as shown in FIG. 1.

When the problem is formulated to carry out numerical calculations this criterion depends on the size of a first cell of numerical grid, starting from the inlet surface of the core. This size is determined by steepness of decrease in concentration profile of penetrated mud particles obtained using the X-ray micro Computed Tomography. It is recommended to choose cell size small enough to ensure that the concentration of penetrated mud particles decreases no more than by 10% over the cell length. Another criterion is provided by convergence of the solution under specified accuracy when the cell size is getting smaller in the vicinity of sandface (i.e.

contact between borehole wall and formation) area or near the inlet surface of the core sample.

3. The critical value $k_{crit}$ is assumed equal to permeability of the external mudcake at the current pressure drop.

These three assumptions are connecting the models developed for the internal and the external mudcakes.

The external mudcake properties (permeability $k_{mc0}$, porosity $\varphi_{mc0}$, compressibility exponents $\nu$ and $\delta$) have been obtained based on the experiment data on injecting a drilling mud into a filter paper or a ceramic disk (see FIG. 2).

Fixing the properties of the external mudcake in the coupled model developed for the external and internal mudcakes we can find the parameters of the internal mudcake (M, $\lambda_{ci}^0$, $\lambda_{mi}^0$, $u_{ci}$, $\beta$) under which calculation results match to both the results of laboratory filtration experiment (dynamics of pressure drop across the core sample, the flow rate of fluid leaving the sample and, optionally, the profile of saturation of the drilling mud filtrate) and the profile of concentration of the penetrated mud particles.

The empirical parameters of the model are considered determined when calculation results correspond both to the experimental data on laboratory filtration and concentration profile plotted for penetrated particles of the drilling mud and additionally to profile of saturation of the drilling mud filtrate.

The empirical model parameters obtained for the model at different concentrations of particles in the injected drilling mud are used to simulate the dynamics of invasion/removal of drilling mud components in the near-wellbore area and corresponding change in its properties under expected conditions of drilling/cleaning (overbalance/underbalance, the number of drilling/clean-up jobs, etc.) and the timetable.

This involves the same coupled model developed for the internal and external mudcakes which now is formulated in cylindrical coordinate system.

I The following initial conditions are specified (prior to drilling onset): an initial pressure, an initial saturation, an initial permeability and an initial porosity of the formation rock.

As a boundary condition at sandface the dynamics of pressure $p(r=R_w,t)$ and concentration of particles in the drilling mud $C_i(r=R_w, t)$ are specified in accordance with planned or realized drilling/cleaning program and the type of drilling muds used.

The time schedule of drilling/cleaning jobs (planned or realized) is specified.

Figure 7:
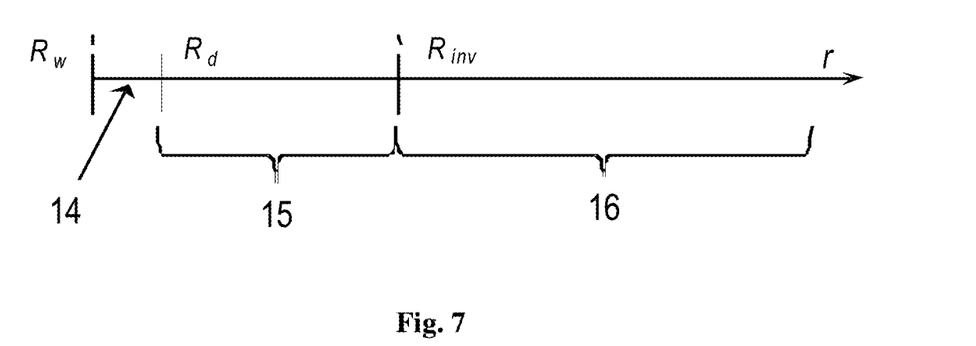

A three-zone spatial grid is used to reduce calculation time without impact on the physics specificity of the process of invasion of the drilling mud into reservoir (FIG. 7):

A uniform extra refined grid 14 is used in zone of accumulation of retained drilling mud particles (the internal mudcake) ranging from the well radius $R_w$ to $R_d$ A uniform refined grid 15 is used in zone of invasion of the drilling mud filtrate inside the space from the boundary of the internal mudcake $R_d$ to $R_{inv}$ An irregular exponential grid 16 covers an area unaffected by the drilling mud components; it is ranging from the boundary of filtrate invasion zone $R_{inv}$ to external grid boundary The external mudcake, developing at the wellbore wall (sandface) is incorporated in the model as an additional, changing in time, hydraulic resistance through the boundary conditions at sandface ($r=R_w$).

Figure 8:
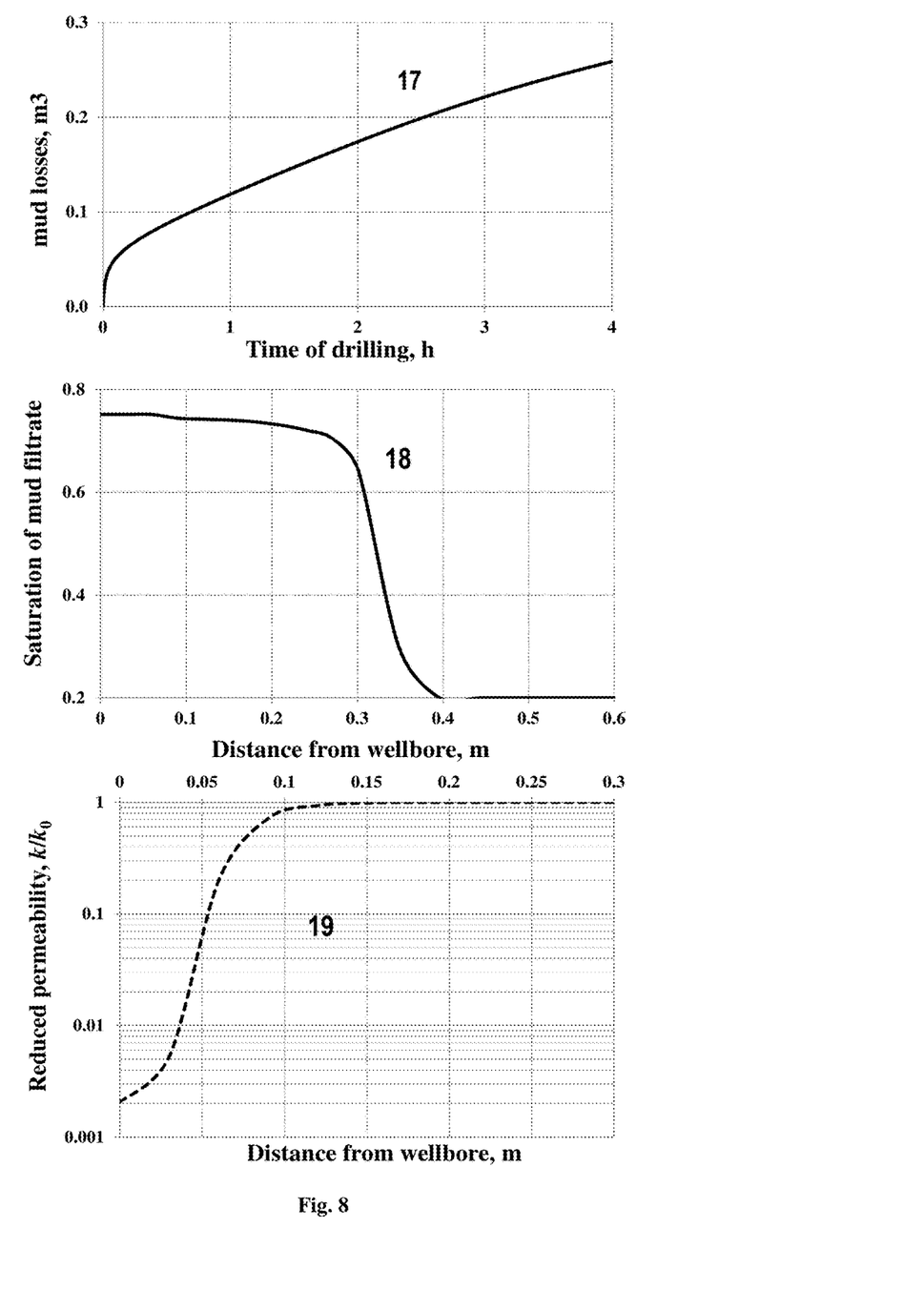
FIG. 8 depicts the calculated dynamics of the loss of drilling mud during the drilling job, as well as the calculated profiles of drilling mud filtrate distribution and damaged permeability (in this case normalized to initial permeability value) in near-wellbore area after 4 hour drilling.

As an example FIG. 8 shows calculated dynamics of loss of the drilling mud 17, as well as calculated distribution profiles plotted for drilling mud filtrate 18 and damaged permeability 19 (the data in this case is normalized to initial permeability) in the near-wellbore area after drilling for 4 hours This approach can be implemented for a variety of drilling muds affecting various core samples to model different lithotypes.

According to above sequence of steps matching the data to experimental laboratory results on injection the drilling mud through a core sample (dynamics of pressure drop across the sample, flow rate of the fluid leaving the sample and, optionally, profile of saturation of drilling mud filtrate) and to results of X-ray micro Computed Tomography parameters of mathematical models of external and internal mudcakes can be found for various combinations of different types of drilling muds affecting the core samples that correspond to different lithotypes.

On the basis of the set of model parameters found for effects of various types of drilling muds on core samples of different lithotypes the relationships ("correlations") can be obtained to link model parameters with the properties of the core (first of all with permeability k, and/or with characteristic pore size $\xi$ and/or wettability) and with parameters of components of drilling mud (first of all, the size of clogging particles r): $k_{mc0}=k_{mc0}(k, \xi, r)$, $\lambda_{ci}^0=\lambda_{ci}^0(k, \xi, r)$, $\lambda_{mi}^0=\lambda_{mi}^0(k, \xi, r)$, $U_{ci}=U_{ci}(k, \xi, r)$, $\beta=\beta(k, \xi, r)$.

Further, if facial composition of formation is known along the well trajectory, the model parameters are calculated according to obtained correlations for each lithological layer to be followed by modeling dynamics of invasion/removal of components of the drilling mud in the near-wellbore area accompanied by changing its properties depending on conditions of drilling/cleaning (overbalance/underbalance, the number of drilling/clean-up jobs, etc.) and the timetable.

The invention claimed is:

1. A method for predicting changes in properties of a formation in a near-wellbore area exposed to a drilling mud comprising:
   determining rheological properties of the drilling mud, of a filtrate of the drilling mud and of a reservoir fluid;
   measuring properties of an external mudcake and porosity and permeability of a core sample;
   using a computer processor to create a mathematical model of the external mudcake to describe a growth of thickness of the external mudcake and an invasion of the filtrate of the drilling mud through the external mudcake;
   injecting the drilling mud into the core sample and measuring dynamics of pressure drop across the core sample and dynamics of a flow rate of a fluid leaving the sample;
   carrying out X-ray micro Computed Tomography of the core sample;
   determining a concentration profile of particles of the drilling mud that had penetrated into the core sample based on analysis of results of the X-ray micro Computed Tomography;
   using the computer processor to create a mathematical model of an internal mudcake to describe dynamics of changes in concentration of drilling mud particles in a pore space of the core sample and associated changes in permeability of the core sample;
   using the computer processor to create a coupled mathematical model of the internal and the external mudcakes comprising the mathematical model of the external mudcake and the mathematical model of the internal mudcake;

determining parameters of the mathematical model of the internal mudcake using the computer processor and the coupled mathematical model of the internal and the external mudcakes, the parameters providing matching of simulation results to the measured dynamics of the pressure drop across the core sample and to the measured dynamics of the flow rate of the fluid leaving the core sample and also to the concentration profile of the particles of the drilling mud that had penetrated the core sample; and using the determined parameters of the mathematical model of the internal mudcake and of the mathematical model of the external mudcake to predict changes in the properties of the formation in the near-wellbore area.

2. The method of claim 1 wherein the parameters of the mathematical model of the internal mudcake are a factor of intensity of decreasing permeability of the rock with the increasing share of the drilling mud particles retained in the pore space, a trapping coefficient of particles of an i-th type, a coefficient of mobilization of the particles of the i-th type, a critical mobilization velocity for the particles of the i-th type, and an empirical factor depending on structure of the pore space and on mechanism of particle retention in the pores of the core sample.

3. The method of claim 1 wherein a dynamics of a saturation profile of the drilling mud filtrate is additionally determined.

4. The method of claim 3 wherein the dynamics of the saturation profile of the drilling mud filtrate is determined by measuring an electric resistance along the sample length during the injection of the drilling mud through the core sample.

5. The method of claim 1, wherein the drilling mud is injected through the core sample with circulation of the drilling mud along a tangent of an inlet surface of the core sample.

6. The method of claim 1 wherein the reservoir fluid is injected additionally through the core sample from the end opposite to the inlet surface of the core sample.

7. The method of claim 1, wherein prior to the injection of the drilling mud into the core sample a preliminary X-ray micro Computed Tomography of the core sample is carried out.

8. The method of claim 1 wherein a contrast agent is added to the drilling mud.

9. The method of claim 1, wherein a plug is cut from the core sample and the X-ray micro Computed Tomography of the plug is carried out.

10. The method of claim 9, wherein the plug has a cylindrical shape.

11. The method of claim 1, wherein the parameters of the mathematical models of the external and the internal mudcakes are determined for core samples of various lithotypes exposed to various drilling muds, relationships between the parameters and properties of the core samples and of the drilling muds are obtained and the obtained relationships are used to model dynamics of invasion or removing components of the various drilling muds from the near-wellbore area and to predict associated changes in properties of the formation rocks in the near-wellbore area during drilling/cleanup jobs.

12. The method of claim 11, wherein the properties of the core samples are permeability, characteristic pore size, and wettability.

13. The method of claim 11, wherein the property of the drilling mud is a size of clogging particles.

* * * * *